(12) United States Patent
Durga et al.

(10) Patent No.: US 11,971,447 B2
(45) Date of Patent: Apr. 30, 2024

(54) AUTOMATIC FAULT INJECTION IN A CLOCK MONITOR UNIT

(71) Applicant: NXP USA, Inc., Austin, TX (US)

(72) Inventors: Praveen Durga, Austin, TX (US); Parul Bansal, Delhi (IN); Ritu Prasad, Uttam Nagar (IN)

(73) Assignee: NXP USA, Inc., Austin, TX (US)

( * ) Notice: Subject to any disclaimer, the term of this patent is extended or adjusted under 35 U.S.C. 154(b) by 848 days.

(21) Appl. No.: 17/024,814

(22) Filed: Sep. 18, 2020

(65) Prior Publication Data

US 2022/0091186 A1 Mar. 24, 2022

(51) Int. Cl.
*G01R 31/317* (2006.01)
*G06F 1/10* (2006.01)
*G01R 23/15* (2006.01)
*G06F 11/07* (2006.01)

(52) U.S. Cl.
CPC ......... *G01R 31/31727* (2013.01); *G06F 1/10* (2013.01); *G01R 23/15* (2013.01); *G06F 11/0751* (2013.01)

(58) Field of Classification Search
USPC ........................................................ 702/176
See application file for complete search history.

(56) References Cited

U.S. PATENT DOCUMENTS

| | | |
|---|---|---|
| 5,479,420 A | 12/1995 | Hong et al. |
| 6,665,367 B1 | 12/2003 | Blair |
| 7,242,223 B1 | 7/2007 | Alon |
| 8,937,496 B1 | 1/2015 | Ahmad et al. |
| 9,336,074 B2 | 5/2016 | Chebruch et al. |
| 10,234,505 B1* | 3/2019 | Shivaray .......... G01R 31/31727 |
| 2014/0232434 A1 | 8/2014 | Koazechi et al. |
| 2015/0033101 A1 | 1/2015 | Chebruch et al. |
| 2016/0359476 A1 | 12/2016 | Yu et al. |
| 2019/0041440 A1* | 2/2019 | Duggal .................. G01R 23/15 |
| 2020/0012313 A1 | 1/2020 | Kilzer et al. |
| 2022/0091186 A1 | 3/2022 | Durga et al. |

OTHER PUBLICATIONS

U.S. Appl. No. 17/024,798, Durga, Praveen: "Fault Injection in a Clock Monitor Unit", filed Sep. 18, 2020.
"The Clock Monitor Unit (CMU)," NXP Semiconductors, Application Note, Document No. AN12080, Rev. 0, Nov. 2017, 8 pages.
"ISO 26262," Wikipedia, Jul. 21, 2020, 7 pages.

* cited by examiner

*Primary Examiner* — Paul D Lee

(57) ABSTRACT

A self-test mechanism within an integrated circuit to automatically interleave evaluation of a clock signal by a clock monitor unit with periodic testing for faulty operation of a clock monitor unit implemented within the integrated circuit for monitoring a clock signal. The mechanism injects faults into the clock monitor unit to evaluate if the clock monitor unit is operating in accordance with its specified operating parameters. The injected faults are intended to cause the clock monitor unit to determine that the clock signal is operating outside of a specified frequency range. If the injected faults do not cause the clock monitor unit to determine that the clock signal is operating both above and below the specified frequency range, then the clock monitor unit is not functioning according to specified operating parameters.

10 Claims, 11 Drawing Sheets

US 11,971,447 B2

AUTOMATIC FAULT INJECTION IN A CLOCK MONITOR UNIT

CROSS-REFERENCE TO RELATED APPLICATION

This application is related to co-pending U.S. patent application Ser. No. 17/024,798, entitled FAULT INJECTION IN A CLOCK MONITOR UNIT, which is hereby incorporated by reference herein.

TECHNICAL FIELD

This disclosure relates in general to clock generation systems, and more particularly, to monitoring operation of a clock monitor unit.

BACKGROUND

Most integrated circuits ("ICs") of sufficient complexity (e.g., microprocessor, microcontroller, system-on-chip ("SoC"), etc.) utilize one or more clock signals in order to synchronize different parts of the circuit. Within such integrated circuits, there may be one or more processor cores and other IP blocks (an IP block refers to a reusable unit of logic), each requiring a reliable clock signal in order to properly function and to interact with each other. These various logic circuits require that their respective clock signal operates at a specified intended frequency within a defined range of frequencies above and below the intended frequency (hereinafter referred to as the "specified frequency range"). However, circuitry within the integrated circuits that generates clock signals may be subject to a latent fault, a corruption of the circuitry, or various environmental conditions that result in a variance of the clock frequency outside of a specified frequency range. A failure of a clock signal to operate within a specified frequency range may result in improper functioning of that particular logic circuitry or even the entire integrated circuit.

This can be especially important when integrated circuits are implemented within applications where there are safety concerns. For example, many microcontrollers and SoCs utilized within automotive vehicles function to perform such critical applications as monitoring the distances between the vehicle and other objects or vehicles, maintaining the vehicle within a driving lane, and collision avoidance (e.g., braking the vehicle before a collision occurs). Such automotive microcontrollers and SoCs are required to comply with ISO26262 Functional Safety Requirements, which is an international standard for functional safety of electrical and/or electronic systems in production automobiles defined by the International Organization for Standardization ("ISO").

In order to address these safety concerns and comply with ISO26262, manufacturers of automotive microcontrollers and SoCs implement a clock monitor unit to monitor each of one or more clock signals delivered to particular logic circuitry within the integrated circuit where it is critical to detect loss of clock or a clock signal otherwise operating outside of a specified frequency range. Such clock monitor units may serve to measure the frequency of an internal oscillator, monitor an external oscillator clock, and/or monitor a selected clock signal within the integrated circuit. The clock monitor unit is required to constantly monitor the health of a particular operating clock, and any faulty operation of the clock monitor unit logic circuitry might lead to not detecting an unhealthy clock, thereby causing a serious functional safety mechanism failure.

However, if circuitry within a clock monitor unit becomes corrupted at some time during its operation lifecycle, has a faulty operation due to various changes in environmental conditions, has any latent (hidden) faults (for example, faulty circuitry that was not discovered during design, manufacturing, or testing of the integrated circuit), or otherwise stops operating in accordance with specified operating parameters (any of which mean that the clock monitor unit cannot relied upon to satisfactorily monitor a clock signal), these also need to be detected and handled within the integrated circuit and/or by other electronic systems functioning within the automotive vehicle.

Furthermore, there is an architectural weakness in many typical automotive integrated circuits in that the BIST (built-in self-test) clocks and BIST watchdog clocks cannot be monitored because the clock monitor units attached to these nodes are part of the LBIST (logic built-in self-test), and therefore, there is no system or process within the integrated circuit for monitoring these particular clocks during an LBIST operation.

DETAILED DESCRIPTION

Embodiments of the present disclosure provide for a self-test mechanism within an integrated circuit to automatically test for faulty operation of a clock monitor unit implemented within the integrated circuit for monitoring a clock signal. Embodiments of the present disclosure periodically inject faults into the clock monitor unit to evaluate if the clock monitor unit is operating in accordance with its specified operating parameters. The injected faults are intended to cause the clock monitor unit to determine that the clock signal is operating outside of a specified frequency range. If the injected faults do not cause the clock monitor unit to determine that the clock signal is operating both above and below the specified frequency range, then the clock monitor unit is not functioning according to specified operating parameters.

In accordance with embodiments of the present disclosure, an indication that a clock monitor unit is not functioning in accordance with specified operating parameters means that the clock monitor unit cannot be relied upon to satisfactorily monitor whether a clock signal is operating within a specified frequency range. Such situations may occur when circuitry within the clock monitor unit has become corrupted over time, there is a latent fault in circuitry of the clock monitor unit, or variances in operation occur due to environmental conditions.

Figure 1:
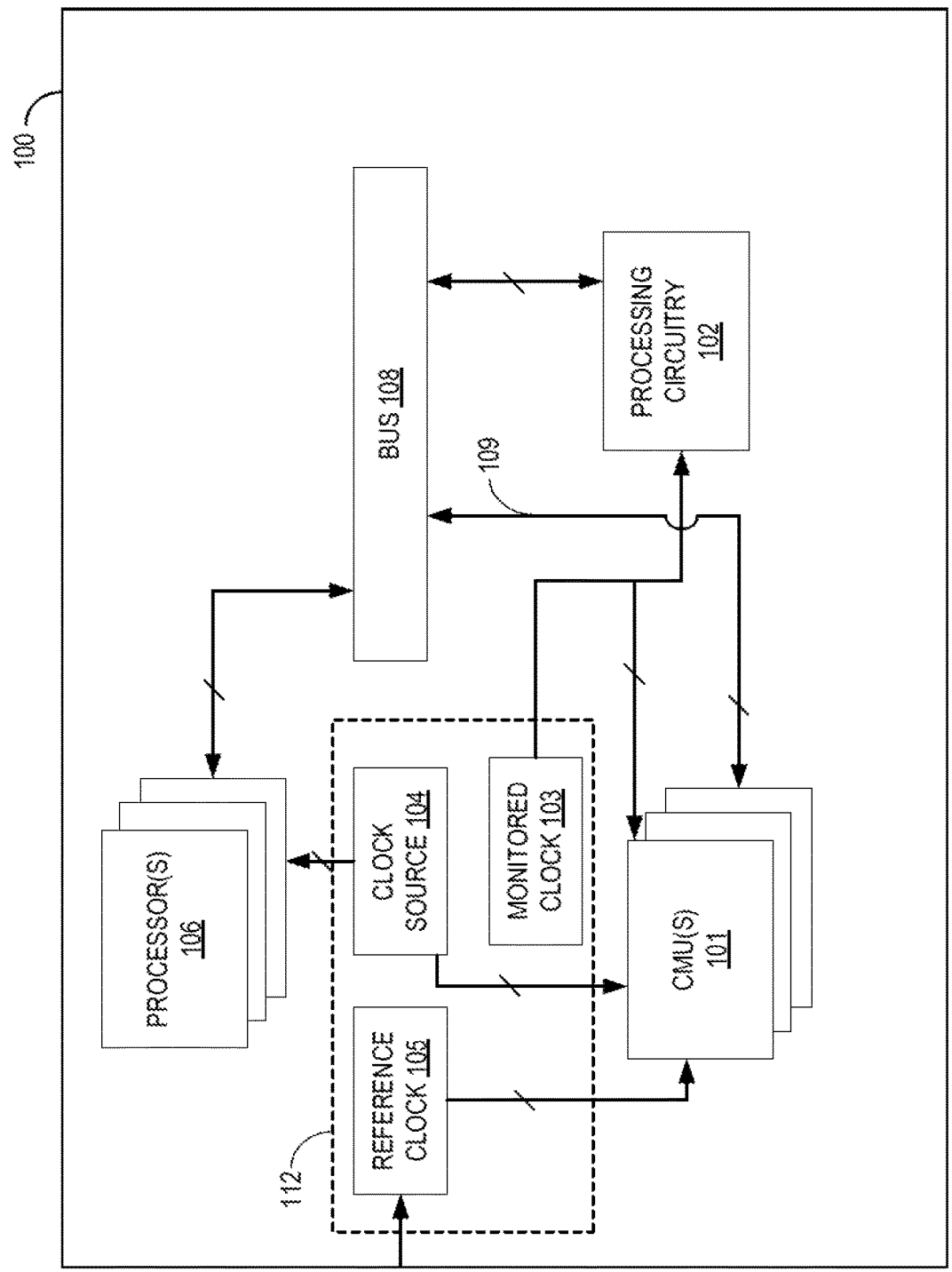
FIG. 1 illustrates a block diagram of an integrated circuit configured in accordance with embodiments of the present disclosure.

FIG. 1 illustrates an exemplary integrated circuit 100 configured in accordance with embodiments of the present disclosure. The integrated circuit 100 may be a microprocessor, microcontroller, system-on-chip ("SoC"), or any integrated circuitry using one or more clock signals. The terms "clock signal" and "clock" will be used interchangeably in this disclosure. The integrated circuit 100 may find use in a large number of possible applications. For example, the integrated circuit 100 may be used in any applications that require a high degree of accuracy and/or safety including, but not limited to, automotive controllers, flight systems, communication systems, medical applications, or other applications involving mission-critical processor devices or other devices that use clock signals.

The integrated circuit 100 includes clock generation circuitry 112, which may include one or more clock sources and/or a clock divider network (not shown) configured in any suitable well-known manner for generating one or more clock signals that can be used by one or more other components of the integrated circuit 100. In the non-limiting exemplary embodiment illustrated in FIG. 1, the clock generation circuitry 112 may include a reference clock source 105 generating a reference clock signal (referred to herein as the reference clock 105). The reference clock 105 may be generated from a source external to the integrated circuit 100, such as an external crystal oscillator (not shown), or originate from another integrated circuit (not shown). The clock generation circuitry 112 may further include a clock source 104 that generates an operating clock for use by various circuitry (e.g., processor cores, digital signal processors, field programmable gate arrays, application specific integrated circuits, discrete logic circuits, etc., all of which are generally designated as processor(s) 106 in FIG. 1) within the integrated circuit 100 that communicate with each other over a system bus 108. The clock source 104 may generate the operating clock from a node within a clock divider network of the clock generation circuitry 112. The integrated circuit 100 may include any number of such clock sources. The monitored clock 103 may also be generated from a node within a clock divider network of the clock generation circuitry 112. For purposes of describing embodiments of the present disclosure, the operating clock from the clock source 104 and the monitored clock 103 are separately generated clock signals within the clock generation circuitry 112. The operating clock from the clock source 104 and the monitored clock 103 may be generated within the clock generation circuitry from the reference clock 105.

In the example shown in FIG. 1, the monitored clock 103 is provided to the processing circuitry 102. The processing circuitry 102 may include any suitable logic device(s), such as one or more processor cores, digital signal processors, field programmable gate arrays, application specific integrated circuits, or discrete logic circuits, etc., which performs operations using the monitored clock 103.

One or more clock monitor units ("CMUs") 101 are implemented in the integrated circuit 100 to monitor one or more clock sources (e.g., the clock source 104, the monitored clock 103, the reference clock 105), and to output a signal indicating whether the monitored clock signal is operating within a specified frequency range. For purposes of describing exemplary embodiments of the present disclosure, the CMU 101 is configured to monitor and evaluate the monitored clock 103 provided to the processing circuitry 102.

For example, as described in more detail herein, the CMU 101 receives the monitored clock 103, counts a number of pulses in the monitored clock 103 during a specified time period (e.g., as measured by another clock signal), and compares the counted number of pulses to one or more thresholds (such as thresholds defining the boundaries of a range of acceptable count values representing a specified frequency range of the monitored clock 103). If the counted number of pulses fails to satisfy either of the thresholds, the CMU 101 is designed to determine that an error in the clock signal has been detected (i.e., operating outside of the specified frequency range), and take suitable action (e.g., outputting a clock fail signal).

In accordance with embodiments of the present disclosure, each CMU 101 may be coupled to one associated clock source. As a result, each CMU 101 may be used to monitor one clock source (e.g., the monitored clock 103). However, other embodiments may also be used, such as when a single clock monitor unit is used to monitor different clock sources in an interleaved manner. In general, any number of clock monitor units can be used with any number of clock sources.

Figure 4:
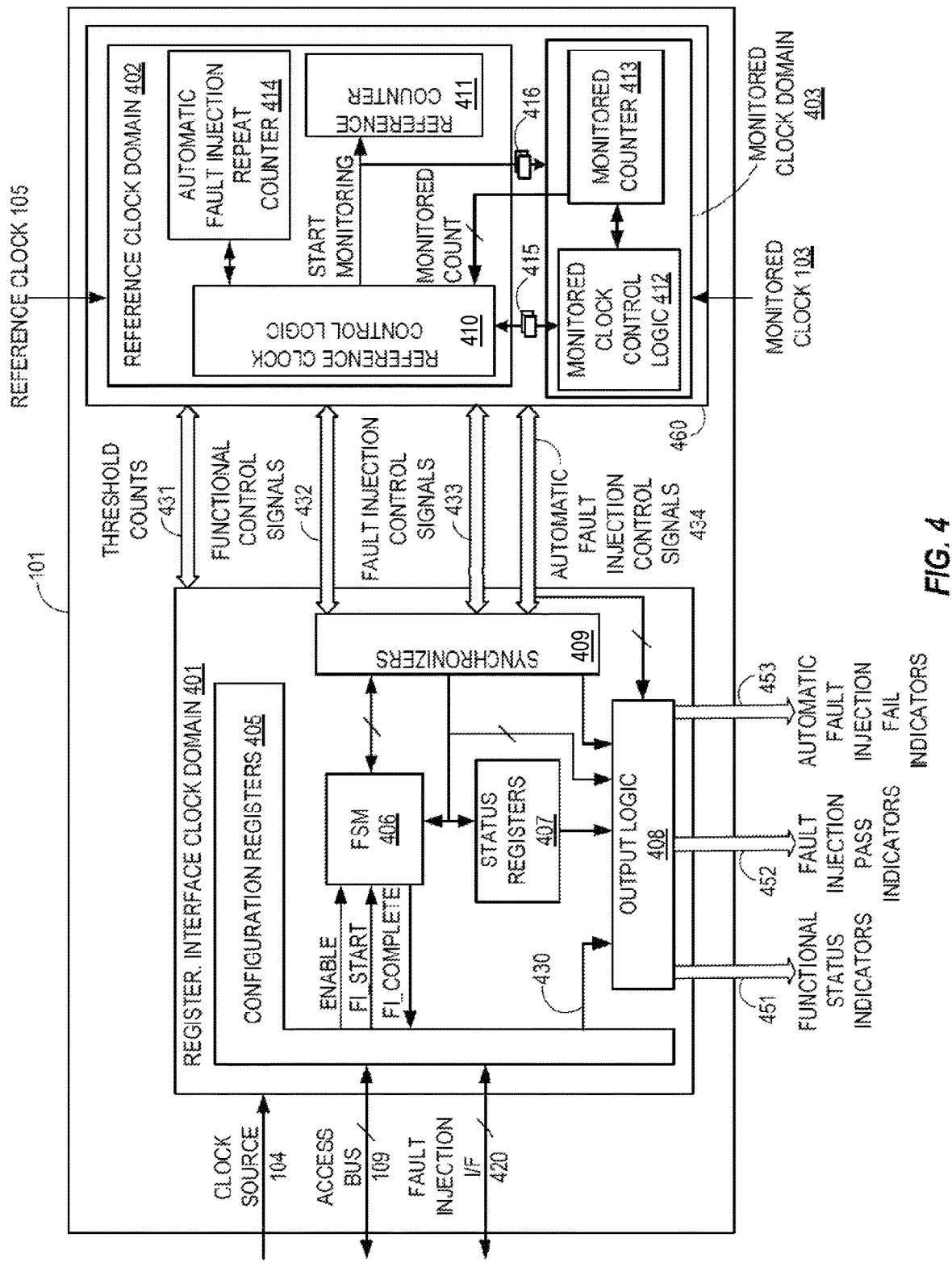
FIG. 4 illustrates a block diagram of a clock monitor unit configured in accordance with embodiments of the present disclosure.

FIG. 4 illustrates a block diagram of an exemplary embodiment of a CMU 101. The CMU 101 includes a register interface clock domain module 401 and clock monitoring control logic 460, which includes a reference clock domain module 402 and a monitored clock domain module 403. The register interface clock domain module 401 includes configuration registers 405, status registers 407, a finite state machine ("FSM") 406, output logic 408, and one or more synchronizers 409. The circuitry within the register interface clock domain module 401 is operated by an externally generated clock signal, such as from a clock source 104. The clock signal from the clock source 104 may operate at a frequency by which other logic circuitry functions within the integrated circuit 100. Additionally, the register interface clock domain module 401 may be coupled to other circuitry within the integrated circuit 100 by the access bus 109, which may be coupled to a system bus (e.g., the system bus 108 in FIG. 1). Circuitry within the register interface clock domain module 401 operates to communicate signals, as described herein, between the CMU 101 and other elements within the integrated circuit 100, and to communicate operating parameters to and receive clock monitor results from the clock monitoring control logic 460.

Figure 5A:
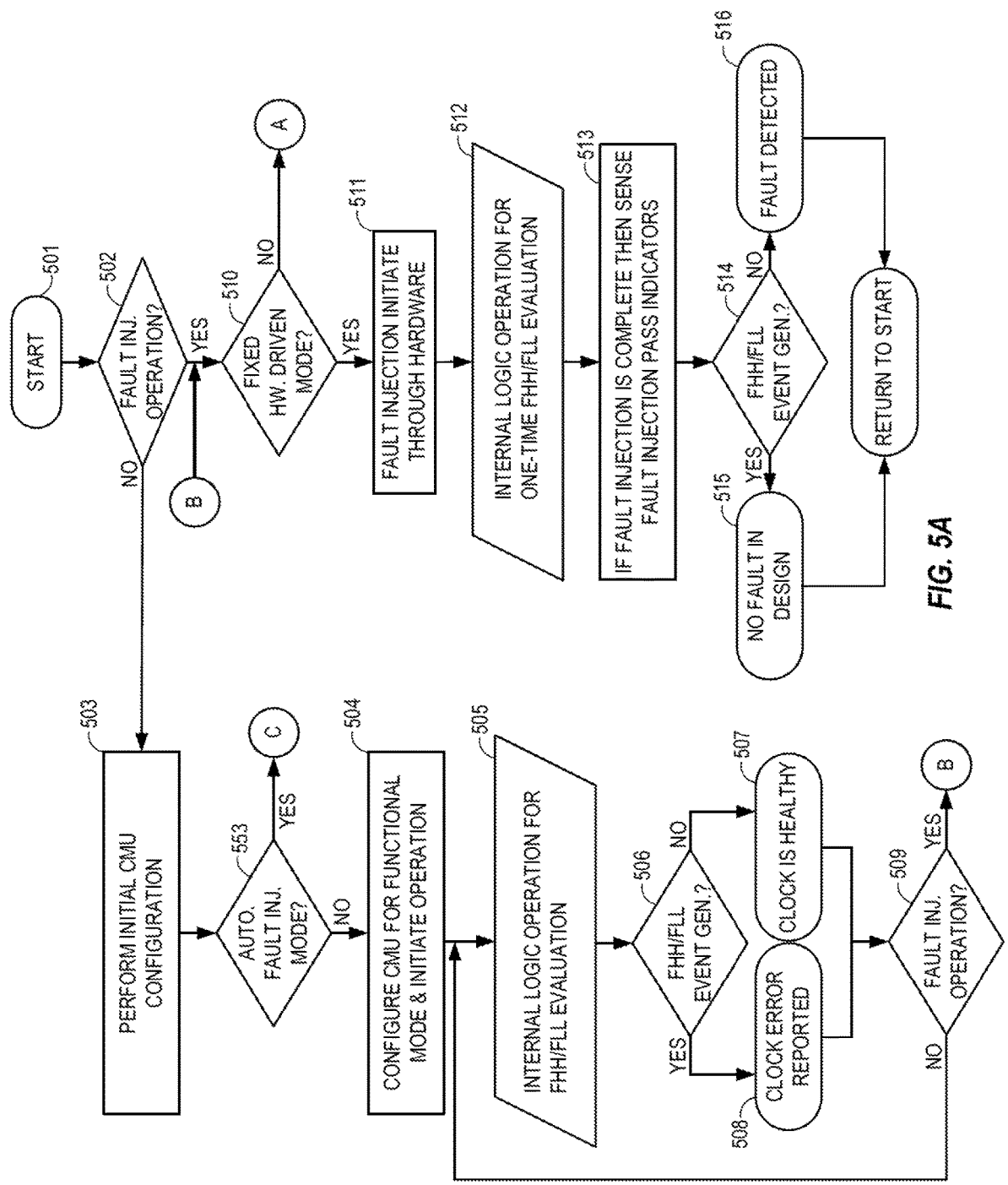
FIGS. 5A-5C illustrate a flow chart diagram pertaining to operations of a clock monitor unit in accordance with embodiments of the present disclosure.
Figure 5B:
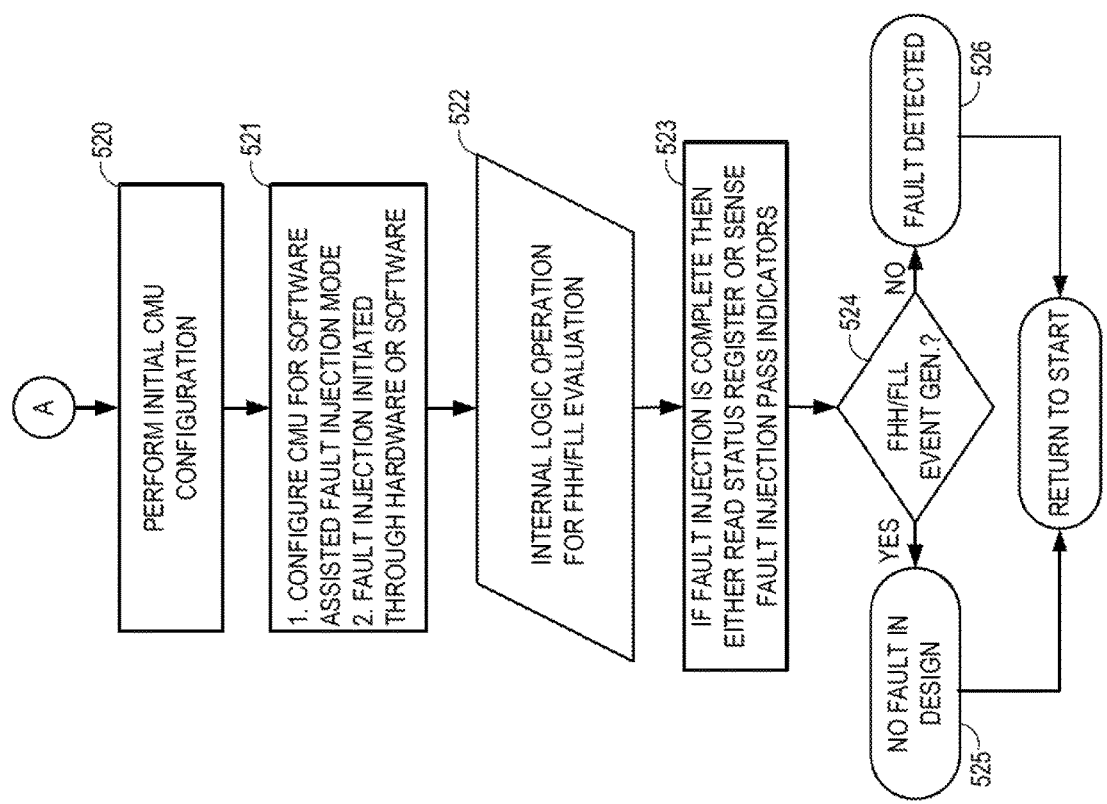
Figure 5C:
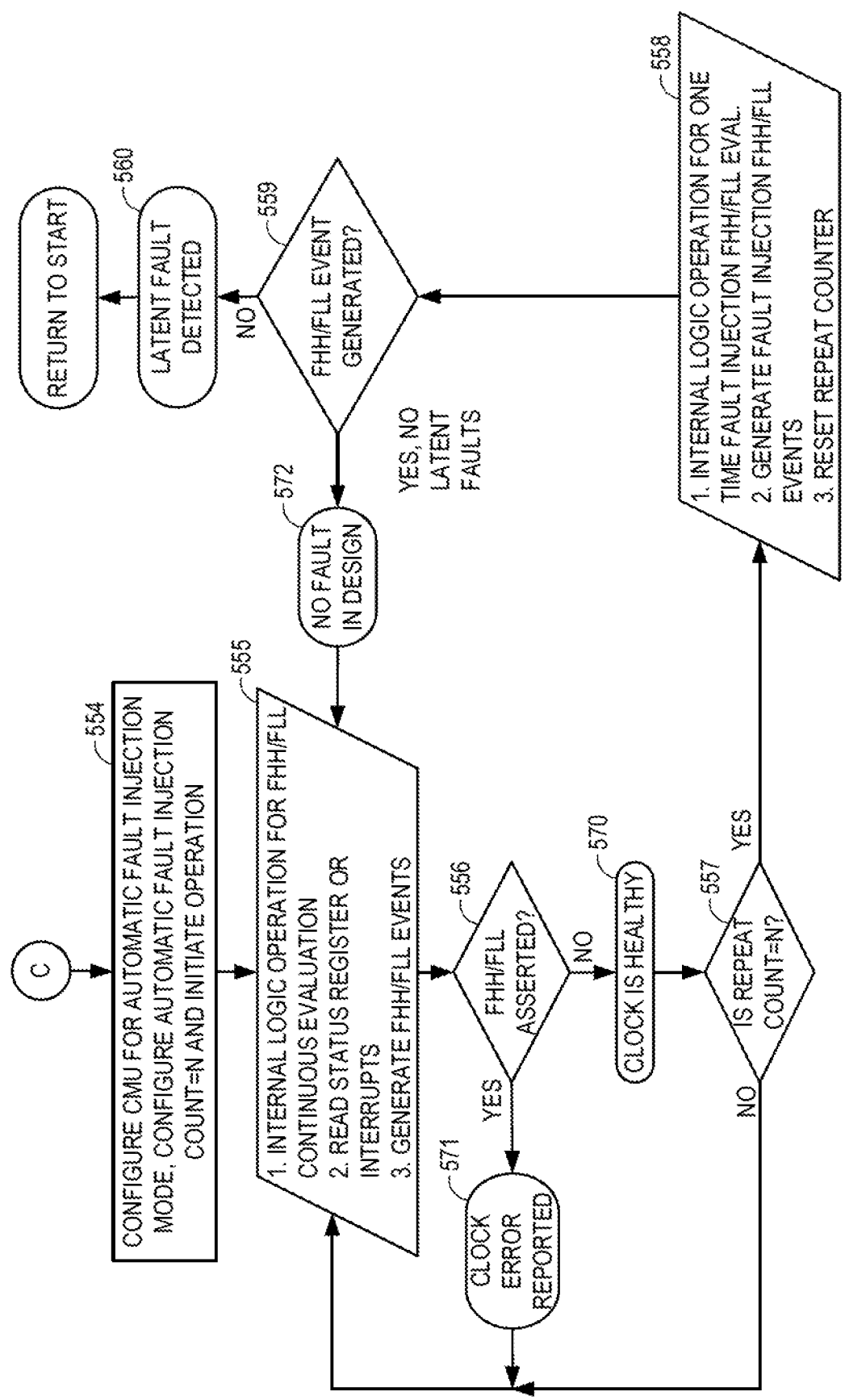

As will be further described herein with respect to FIGS. 5A-5C, logic circuitry within the FSM 406 can be configured to control whether the CMU 101 operates in accordance with a Functional Operating Mode, a Fault Injection Operating Mode, and/or an Automatic Fault Injection Operating Mode, which combines features of the Functional Operating Mode and the Fault Injection Operating Mode. The FSM 406 may be implemented in hardware, such as with one or more programmable logic devices and other hardware components. However, any hardware or combination of hardware and software/firmware may be used to implement the FSM 406 suitable for utilization in accordance with embodiments of the present disclosure.

As described herein with respect to operation of these modes, the register interface clock domain module 401 can receive configuration parameters associated with each of the modes via the fault injection interface 420 and/or the access bus 109, wherein these signals and configuration parameters may be stored within the configuration registers 405, and output results via the output logic 408, the functional status indicators signal lines 451, the fault injection pass indicators signal lines 452, and the automatic fault injection fail indicators signal lines 453. The FSM 406 accesses the settings of these configuration parameters in the configuration registers 405 for determining and initiating which of the modes to operate.

The status registers 407 may be configured to store results of the Functional Operating Mode, the Fault Injection Operating Mode, and/or the Automatic Fault Injection Operating Mode as received from the clock monitoring control logic 460. One or more synchronizers 409 may be implemented in order to facilitate communication of various signals between the register interface clock domain module 401 and the reference clock domain module 402, since these modules may operate under different clock domains. The synchronizers 409 may be implemented in accordance with well-known circuitry.

The clock monitoring control logic 460 operates to perform an evaluation of the monitored clock 103 in accordance with embodiments of the present disclosure. The monitored clock domain module 403 includes the monitored clock control logic 412 that operates to receive the monitored clock signal 103, and includes the monitored clock counter 413 for counting pulses of the monitored clock 103. Operation of the monitored clock control logic 412 is well-known in the art.

The clock monitoring control logic 460 utilizes the reference clock 105 as a safe clock reference to evaluate the monitored clock 103. For example, the reference clock 105 may be utilized as the safe clock since it may be considered to have a stable and known frequency (e.g., since it may originate from a stable frequency source generated externally from the integrated circuit 100). Such an external clock source may be generated by an externally implemented oscillator or may originate from some other circuit elements or integrated circuits. However, embodiments of the present disclosure are not limited to use of such a reference clock 105, but may utilize any other clock source within the integrated circuit 100 (e.g., a clock source 104).

The reference clock domain module 402 operates in accordance with the reference clock 105 and includes the reference clock control logic 410 and the reference counter 411. As will be further described herein, the reference clock control logic 410 operates in a well-known manner to compare the counts (i.e., counted pulses) of the monitored clock 103 to threshold counts (such as thresholds defining the boundaries of a range of acceptable count values representing a specified frequency range of the monitored clock 103). The reference clock control logic 410 receives the configuration parameters utilized for the comparison from the configuration registers 405 via the threshold counts signal lines 431. These configuration parameters include a Reference Clock Count used by the reference clock control logic 410 to determine how many pulses of the reference clock 105 (as counted by the reference counter 411) to utilize in the comparison. The configuration parameters also include a first threshold count representing a first frequency value and a second threshold count representing a second frequency value, wherein the first and second frequency values represent the boundaries of the range of frequencies for the specified frequency range for the monitored clock 103. In the comparison, the reference clock control logic 410 is configured to determine whether the counts of the monitored clock 103 (representing the frequency at which the monitored clock 103 is currently operating) are less than or equal to the first threshold count, and determine whether the counts of the monitored clock 103 are greater than or equal to the second threshold count, and in response to these determinations, output corresponding signals. These signals are communicated from the reference clock control logic 410 to the register interface clock domain module 401 for further handling as described herein.

In accordance with operations of the Automatic Fault Injection Operating Mode, the reference clock domain module 402 may utilize an automatic fault injection repeat counter 414, as will be further described with respect to FIG. 5C. Implementations of counters, such as the reference counter 411 and the automatic fault injection repeat counter 414 are well-known in the art.

One or more synchronizers 415, 416 may be implemented in a well-known manner to facilitate communication between the monitored clock domain module 403 and the reference clock domain module 402, since these modules each operate in accordance with different clock domains, i.e., the clock domain of the monitored clock 103 and the clock domain of the reference clock 105, respectively.

Note that the embodiment of the CMU 101 of FIG. 4 is merely exemplary, and that embodiments of the present disclosure are applicable to any suitable clock monitor unit configuration. In some embodiments, the various components of the CMU 101 can be implemented in hardware, such as with one or more programmable logic devices and other hardware components. However, any hardware or combination of hardware and software/firmware may be used to implement the various portions of a clock monitor unit suitable for utilization in accordance with embodiments of the present disclosure.

FIGS. 5A-5C illustrate a system and process 501 of operations of the Functional Operating Mode, the Fault Injection Operating Mode, and the Automatic Fault Injection Operating Mode performed within the integrated circuit 100. In accordance with certain embodiments of the present disclosure, one or more certain aspects of these modes may be configured for operation within the CMU 101 during any stage of the design, manufacturing, or end use application of the integrated circuit 100. For example, the CMU 101 may be configured to operate in accordance with either the Functional Operating Mode or the Automatic Fault Injection Operating Mode during design and manufacturing of the integrated circuit 100. Accordingly, the CMU 101 may be implemented to perform operations of the Functional Operating Mode or the Automatic Fault Injection Operating Mode on a substantially continuous basis during the end use application of the integrated circuit 100. As such, the configuration parameters utilized by the CMU 101 for performing operations in accordance with either the Functional Operating Mode or the Automatic Fault Injection Operating Mode may be programmed into the CMU 101 (e.g., into the configuration registers 405) at a predetermined time (e.g., during design, manufacturing, and/or configuration of the integrated circuit 100).

Figure 2:
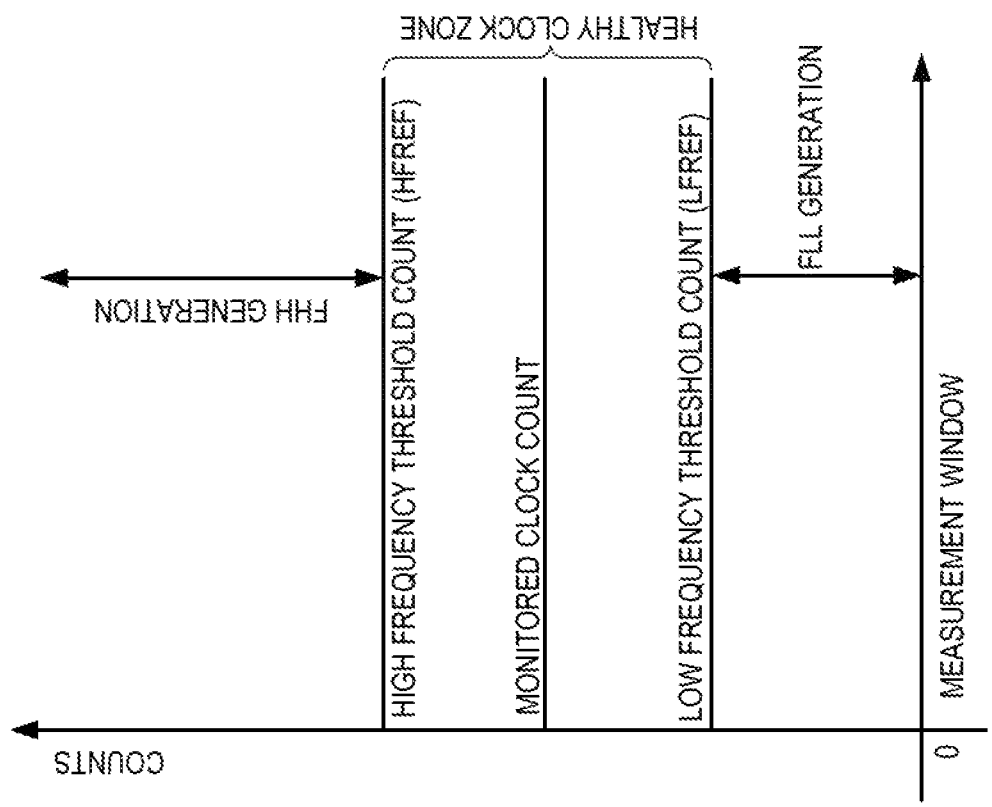
FIG. 2 illustrates a diagram of an example of a Functional Operating Mode for monitoring of a clock signal by a clock monitor unit.

Referring to FIGS. 2, 4, and 5A, operations of the Functional Operating Mode will be described.

If the integrated circuit 100 is configured to control which mode to operate within the CMU 101, a determination may be made in the process block 502 whether to perform operations according to the Fault Injection Operating Mode (e.g., by the FSM 406 accessing the setting of FI_Start in the configuration registers 405). For example, software running within a processor 106 may be configured to interrupt the Functional Operating Mode as will be described herein. If the CMU 101 is not configured to operate in accordance with the Fault Injection Operating Mode, in the process block 503, the following configuration parameters may be stored within the configuration registers 405 via the access bus 109 in any suitable manner: Reference Clock Count ("REF-COUNT"), High Frequency Threshold Count ("HFREF"), and Low Frequency Threshold Count ("LFREF").

The HFREF is the predetermined threshold number of pulse counts representing the highest acceptable frequency of the specified frequency range for the monitored clock 103. The LFREF is the predetermined threshold number of pulse counts representing the lowest acceptable frequency of the specified frequency range for the monitored clock 103.

In the process block 553, the FSM 406 checks the configuration registers 405 to determine whether the CMU 101 is to operate in accordance with the Functional Operating Mode or the Automatic Fault Injection Operating Mode. If the CMU 101 has been instructed to operate in accordance with the Functional Operating Mode, then in the process block 504, if the Functional Operating Mode has been enabled, the FSM 406 then loads these configuration parameters via the threshold counts signal paths 431 to the reference clock control logic 410 before initiating the frequency evaluation operation of the Functional Operating Mode by the clock monitoring control logic 460 (e.g., by sending an appropriate start signal via the functional control signals 432, which may also include configuration load and acknowledge signals between the FSM 406 and the clock monitoring control logic 460). The reference clock control logic 410 will input the received HFREF configuration parameter as the first threshold pulse count value, and the received LFREF configuration parameter as the second threshold pulse count value. In the process block 505, the clock monitoring control logic 460 uses the loaded configuration parameters to perform the evaluation of the monitored clock 103.

FIG. 2 illustrates a diagram showing an exemplary operation of the Functional Operating Mode whereby the CMU 101 monitors and evaluates the health of a clock signal operating within the integrated circuit 100. As previously described, such a clock signal (e.g., the monitored clock 103) may be implemented for providing an operating clock to a particular set of logic circuits (e.g., the processing circuitry 102) performing a particular task within the integrated circuit 100. During the Functional Operating Mode, the CMU 101 evaluates the monitored clock 103 to determine whether it is operating within a specified frequency range by using another clock signal as a reference (e.g., the reference clock 105).

FIG. 2 shows the measurement window as governed by the predetermined REFCOUNT parameter, which is compared to a counted number of cycles of the reference clock 105 by the reference counter 411. Under direction of the monitored clock control logic 412, the monitored clock counter 413 counts the clock cycles (counted pulses) of the monitored clock 103 in the time duration of REFCOUNT counted by the reference counter 411. After each measurement window, the monitored clock pulse count is compared to HFREF and LFREF by the reference clock control logic 410.

If the reference clock control logic 410 determines that the monitored clock count is greater than the first threshold count (i.e., HFREF), then the reference clock control logic 410 generates a Frequency Higher than High Threshold ("FHH") event. If the reference clock control logic 410 determines that the monitored clock count is less than the second threshold count (i.e., LFREF), then the reference clock control logic 410 generates a Frequency Lower than Low Threshold ("FLL") event.

As shown in FIG. 2, an FHH event will be generated if the reference clock control logic 410 determines that the monitored clock 103 has a frequency value greater than the frequency value associated with HFREF. A FLL event will be generated if the reference clock control logic 410 determines that the monitored clock 103 has a frequency value less than the frequency value associated with LFREF. In accordance with embodiments of the present disclosure, generation of the FHH and FLL events may involve asserting (e.g., changing a logic level) an otherwise de-asserted signal. Event signals representing whether the FHH and FLL events have occurred or not are transmitted from the reference clock control logic 410 via the functional control signals paths 432. These signals may be also stored in the status registers 407 under control of the FSM 406. The status (e.g., logic levels) of the FHH and FLL event signals may be output asynchronously and/or synchronously from the CMU 101 via the output logic 408 and the functional status indicators signal lines 451. An asynchronous output may occur directly from the generation (e.g., asserted or de-asserted logic levels) of the FHH and FLL event signals by the reference clock control logic 410.

The FSM 406 may be configured to synchronously output the status of the FHH and FLL event signals within via the output logic 408 and the functional status indicators 451. For example, in the process block 505, the FSM 406 may read these values of the event signals in the status register 407 to determine whether an FHH or an FLL event has been generated in the process block 506. In the process block 508, if one of these events has been generated, then the FSM 406 may output, via the output logic 408, a signal (e.g., either FHH or FLL) that reports that there is an error in the monitored clock 103 (i.e., it is functioning outside of its specified operating frequency) as one of the output functional status indicators 451. If the FSM 406 does not determine that an FHH or FLL event has been generated, then in the process block 507, the FSM 406 may output via the functional status indicators 451 that the monitored clock 103 is operating within its predetermined acceptable frequency range, i.e., the "Healthy Clock Zone" depicted in FIG. 2.

In the process block 509, the FSM 406 may determine whether the Fault Injection Operating Mode has been enabled within the CMU 101, as further described herein. If not, then the Functional Operating Mode is performed for another measurement window in the process block 505. If the Fault Injection Operating Mode has been enabled, then the FSM 406 will interrupt the Functional Operating Mode and proceed to the process block 510 as will be further described herein. Further note that the process blocks 506 . . . 508 may be performed in parallel with the process block 509, i.e., the CMU 101 performs the continuous monitoring of the monitored clock 103 in accordance with the Functional Operating Mode, and does not have to wait for operations of the process blocks 506 . . . 508 before initiation of the next measurement window.

In accordance with embodiments of the present disclosure, the CMU 101 may be configured to operate in accordance with the Functional Operating Mode on a continuous basis except for instances when the CMU 101 is instructed to perform (or enter into) the Fault Injection Operating Mode.

Note that, in accordance with certain embodiments of the present disclosure, the CMU 101 may be configured with the configuration parameters for the Functional Operating Mode (e.g., during the design, manufacturing, and/or configuration of the integrated circuit 100) so that the CMU 101 has a default configuration to operate in accordance with the Functional Operating Mode unless interrupted by the Fault Injection Operating Mode. In such a situation, the process block 503 is optional or not required, and at startup or resetting of the integrated circuit 100, the FSM 406 merely determines whether to operate the CMU 101 in accordance with either the Functional Operating Mode or the Fault Injection Operating Mode in the process block 502 (e.g., by accessing the setting of the FI_Start in the configuration registers 405).

An exemplary operation of the Fault Injection Operating Mode will now be described with respect to FIGS. 3A-3B demonstrating how the CMU 101 may be configured to deliberately inject faults into the CMU 101 to evaluate whether the CMU 101 is functioning in accordance with its specified operating parameters.

Figure 3B:
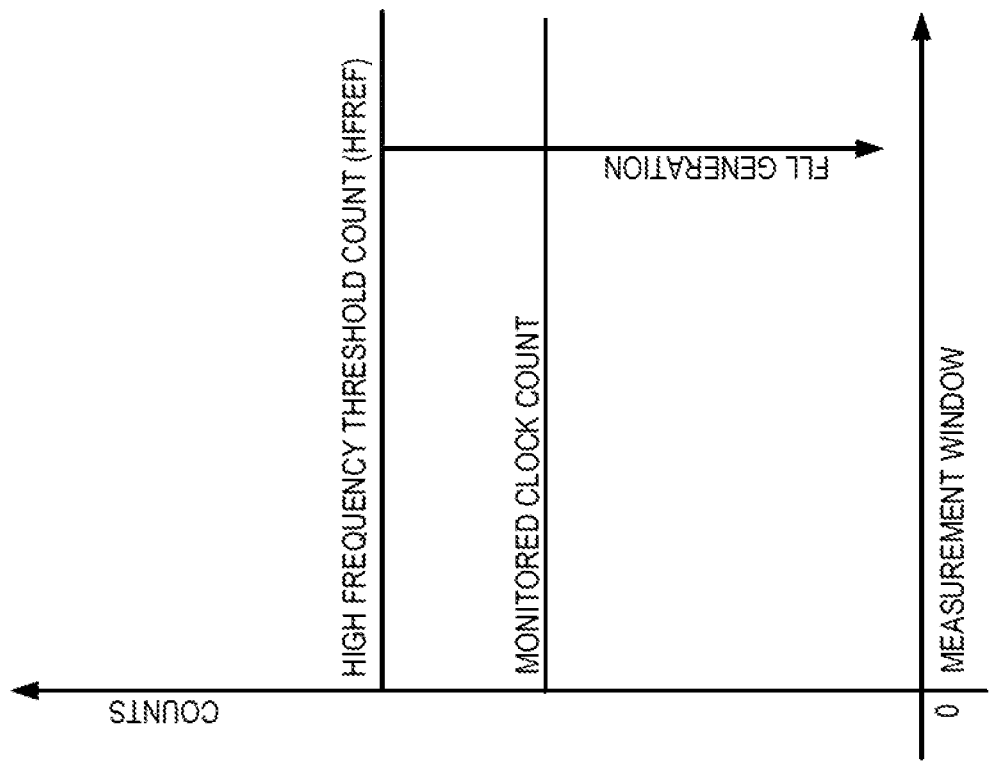
FIGS. 3A-3B illustrates a diagram of an example of a Fault Injection Operating Mode configured in accordance with embodiments of the present disclosure.
Figure 3A:
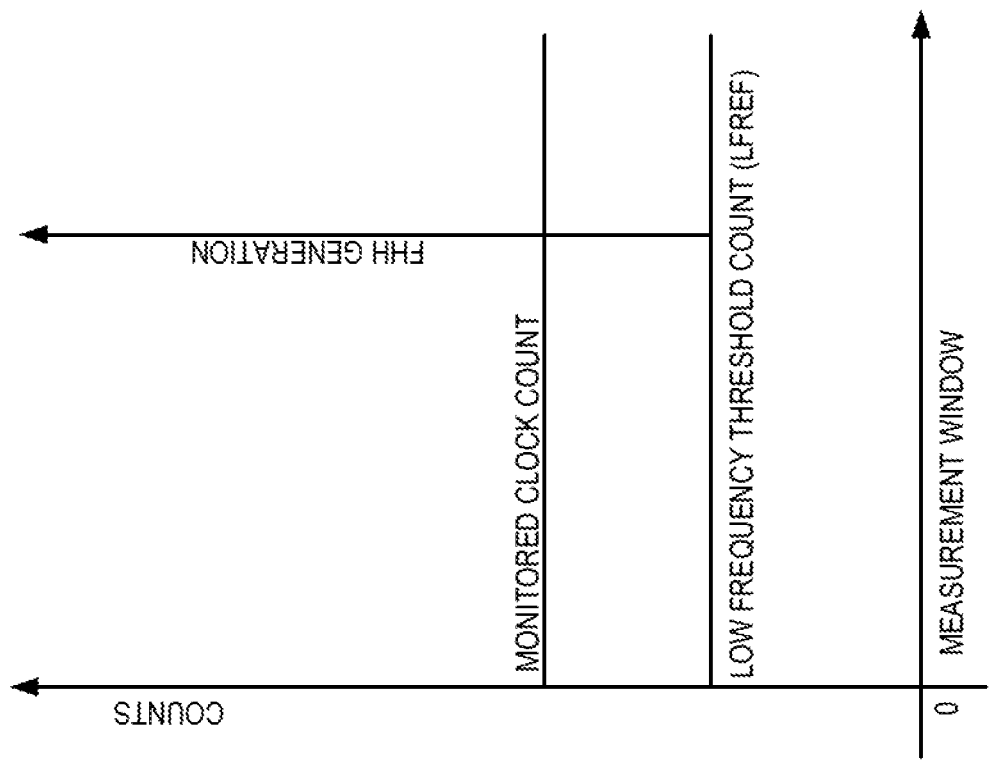

As shown in FIGS. 3A-3B, operations of the Fault Injection Operating Mode may be based on intentionally generating FHH and FLL events. This may be performed by inversely using (i.e., swapping) the HFREF and LFREF values such that the LFREF value is used as a high threshold count for FHH event generation, and the HFREF value is used as a low threshold count for FLL event generation or by using the configuration parameters FI_REFCOUNT, FI_HFREF, and FI_LFREF that have been previously stored in the configuration registers 405 (e.g., during the design, manufacturing, and/or configuration of the integrated circuit 100). Utilization of these different configuration parameters will be further described with respect to FIGS. 5A-5B. For purposes of describing how the Fault Injection Operating Mode operates in general, these will be simply referred to as HFREF, LFREF, and REFCOUNT with respect to FIGS. 3A-3B.

Consequently, if the CMU 101 is functioning in accordance with its specified operating parameters, then the reference clock control logic 410 should determine that both the monitored clock count is greater than or equal to LFREF and the monitored clock count is less than or equal to HFREF, resulting in a generation of both of these FHH and FLL events (e.g., an assertion of both the FHH and FLL event signals). In other words, during operations according to the Fault Injection Operating Mode, faults are injected into the clock monitoring process so that the CMU 101 should determine that the frequency of the monitored clock 103 is both higher and lower than the specified frequency range if the CMU 101 is functioning in accordance with its specified operating parameters. This may be accomplished by the FSM 406 loading the HFREF and LFREF configuration parameters from the configuration registers 405 into the reference clock control logic 410 so that the reference clock control logic 410 inputs the LFREF as the first threshold count and the HFREF as the second threshold count. Since the reference clock control logic 410 is configured to output an FHH event when the count of the monitored clock 103 is greater than the first threshold count, it will do so because the count of the monitored clock 103 will be greater than LFREF. And, since the reference clock control logic 410 is configured to output an FLL event when the count of the monitored clock 103 is less than the second threshold count, it will do so because the count of the monitored clock 103 will be less than HFREF.

As will be further described, the generation of the FHH and FLL events will result in the CMU 101 outputting a signal that the CMU 101 is functioning in accordance with specified operating parameters when both of the FHH and FLL events are generated.

However, if during the Fault Injection Operating Mode, the CMU 101 does not determine that either the monitor clock count is greater than or equal to LFREF or is not less than or equal to HFREF, this will indicate that the CMU 101 is not functioning in accordance with its specified operating parameters. As will be further described, this may result in an output of a signal from the CMU 101 indicating that it is not functioning in accordance with its specified operating parameters.

As will be described herein with respect to FIGS. 5A-5B, initiation of the Fault Injection Operating Mode may be implemented within the integrated circuit 100 in software and/or by a fixed hardware mode. For example, the configuration parameters FI_REFCOUNT, FI_HFREF, and FI_LFREF may have been pre-loaded into the configuration registers 405 (e.g., during the design, manufacturing, and/or configuration stages), or the FSM 406 may have been configured to swap the HFREF and LFREF parameters for operation of the Fault Injection Operating Mode. Alternatively, the configuration parameters FI_REFCOUNT, FI_HFREF, and FI_LFREF can be loaded as a result of dynamic software programming running in a processor 106.

Referring to FIG. 4, the fault injection interface ("I/F") 420 may be configured to communicate (e.g., from a software program operating within a processor 106) a fault injection start signal, FI_Start, to the CMU 101 to interrupt the Functional Operating Mode and start the Fault Injection Operating Mode. The fault injection I/F 420 may also include a signal path for communicating a fault injection complete signal, FI_Complete, indicating completion of the Fault Injection Operating Mode from the CMU 101 (e.g., to a software program operating within a processor 106).

The signal paths 451 may include functional status indicators for communicating results of testing by the Functional Operating Mode. The signal paths 452 may include fault injection pass indicators for communicating results of testing by the Fault Injection Operating Mode. In accordance with embodiments of the present disclosure, the CMU 101 may be configured under certain operating conditions to mask the output of the functional status indicators 451 and/or the fault injection status indicators 452 (e.g., by use of one or more masking signals 430 provided to the output logic 408 via the configuration registers 405).

If the Fault Injection Operating Mode is controlled by a software program (e.g., operating within a processor 106), communication of the FI_Start and FI_Complete signals, the configuration parameters, and the fault injection pass indicators 452 may be performed via the access bus 109, which may be coupled to a system bus 108 coupled to the processor 106.

Referring to FIGS. 5A-5C, the Start 501 may represent a startup or resetting of the integrated circuit 100. In the process block 502, the FSM 406 checks whether it is to operate the CMU 101 in accordance with the Functional Operating Mode or the Fault Injection Operating Mode. The FSM 406 may be configured to check the status of a location within the configuration registers 405 as to whether that register location includes an assertion of a bit indicating that the CMU 101 has received the FI_Start signal. If the FSM 406 has not received the FI_Start signal, then the FSM 406 proceeds to the process block 503 to continue operating in accordance with the Functional Operating Mode as previously described. As previously described, the CMU 101 may be configured to operate in the Functional Operating Mode, the Fault Injection Operating Mode, or the Automatic Fault Injection Operating Mode. In such an instance, in the process block 509, the FSM 406 checks whether it has received a signal instructing it to interrupt the Functional Operating Mode and enter into operation of the Fault Injection Operating Mode.

If the FSM 406 observes that the FI_Start signal has been asserted in the configuration registers 405 to perform the Fault Injection Operating Mode, then the FSM 406 proceeds to the process block 510 in which a determination is made whether the Fault Injection Operating Mode is being driven by hardware or software. In accordance with certain embodiments of the present disclosure, if the CMU 101 has been configured with a hardware implementation of the Fault Injection Operating Mode, such an implementation may be a default configuration within the CMU 101 (e.g., by a default condition stored within the configuration registers 405).

In such a default configuration, the FI_HFREF, FI_LFREF, and FI_REFCOUNT configuration parameters previously stored within the configuration registers 405 may be utilized for the Fault Injection Operating Mode. Alternatively, the FSM 406 may utilize the swapped HFREF and LFREF configuration parameters.

If the Fault Injection Operating Mode is being driven by hardware, then the FSM 406 proceeds to the process block 511 whereby it loads the FI_HFREF and FI_LFREF configuration parameters into the reference clock control logic 410 and then sends a start signal (e.g., via the functional control signals 432) to the reference clock control logic 410 whereby, in the process block 512, the reference clock control logic 410 performs the evaluation of the monitored clock 103 in accordance with the Fault Injection Operating Mode. The FSM 406 may also send an interrupt signal (e.g., via the functional control signals 432) to the reference clock control logic 410 to interrupt monitoring of the Functional Operating Mode and wait for the loading of the FI_HFREF and FI_LFREF configuration parameters and the start signal. The reference clock control logic 410 may be configured with well-known logic circuitry in order to implement such an interrupt.

In the process block 512, the FSM 406 waits for the clock monitoring control logic 460 to perform the evaluation of the monitored clock 103 in accordance with the FI_HFREF and FI_LFREF configuration parameters as generally described with respect to FIGS. 3A-3B. The clock monitoring control logic 460 will perform the Fault Injection Operating Mode generating the FHH and FLL event signals, which are transmitted from the reference clock control logic 410 via the synchronizers 409 to be stored within the status registers 407. As described with respect to FIGS. 3A-3B, the FHH and FLL event signals will indicate whether the evaluation of the monitored clock 103 in accordance with the Fault Injection Operating Mode resulted in a pass or fail condition. The FSM 406 may be notified, or may sense the receipt of the FHH and FLL event signals within the status registers 407 and will proceed to the process block 513 to wait for receipt of a fault injection complete indication signal from the reference clock control logic 410 indicating a completion of the Fault Injection Operating Mode. The reference clock control logic 410 may be configured with well-known logic circuitry in order to implement such a fault injection complete indication signal.

Once the fault injection complete indication signal is received by the FSM 406, the FSM 406 will read the status registers 407 to determine in the process block 514 whether FHH and/or FLL events were generated. If both FHH and FLL events were generated, then in the process block 515 the FSM 406 will output a signal that there was no fault detected (i.e., the CMU 101 is functioning in accordance with specified operating parameters). Such a signaling may be transmitted from the output logic 408 via the fault injection pass indicators 452 signaling paths as an assertion (or de-assertion as the case may be) of synchronously and/or asynchronously generated pass/fail signals. If, however, either an FHH or FLL event was not generated, then the FSM 406 will determine in the process block 516 that a fault was detected (i.e., the CMU 101 is not functioning in accordance with specified operating parameters) and output corresponding signals via the fault injection pass indicators 452 signaling paths as a de-assertion (or assertion as the case may be) of the synchronously and/or asynchronously generated pass/fail signals. In accordance with embodiments of the present disclosure, the asynchronously generated pass/fail signal (e.g., whether asserted or de-asserted) may be performed by combinatorial logic circuits within the output logic 408 as a function of the assertion/de-assertion of the FHH and FLL event signals.

If in the process block 510 it is determined by the FSM 406 that the Fault Injection Operating Mode is being driven by software (e.g., a software program running in a processor 106), in the process block 520, the configuration parameters for the REFCOUNT, HFREF, and LFREF are determined (e.g., either to swap the HFREF and LFREF values used in the Functional Operating Mode for use in the Fault Injection Operating Mode, or new values are loaded into the configuration registers 405 from the software program via the access bus 109). The FSM 406 may access the status of a register in the configuration registers 405 to determine if the software program enabled Fault Injection Operating Mode is to be performed. In the process block 521, the FSM 406 loads the swapped HFREF and LFREF parameters into the reference clock control logic 410 and then sends a start signal whereby the reference clock control logic 410 performs the evaluation of the monitored clock 103.

In accordance with embodiments of the present disclosure, instead of swapping the HFREF and LFREF parameters, other predetermined threshold count values may be input into the CMU 101 and utilized for the Fault Injection Operating Mode as long as such predetermined threshold count values are configured so that the CMU 101 determines that the frequency of the monitored clock 103 is both higher than the specified frequency range and lower than the specified frequency range when the CMU 101 is functioning in accordance with specified operating parameters.

In the process block 522, the clock monitoring control logic 460 performs the evaluation of the monitored clock 103 in accordance with the loaded HFREF and LFREF parameters as described with respect to FIGS. 3A-3B. The clock monitoring control logic 460 will perform the Fault Injection Operating Mode generating assertions or de-assertions of the FHH and FLL event signals, which are transmitted from the reference clock control logic 410 via the synchronizers 409 to be stored within the status registers 407. As described with respect to FIGS. 3A-3B, the FHH and FLL event signals will indicate whether the evaluation of the monitored clock 103 in accordance with the Fault Injection Operating Mode resulted in a pass or fail condition.

The FSM 406 may be notified, or may sense the receipt of the FHH and FLL event signals within the status registers 407 and will proceed to the process block 523 to wait for receipt of the fault injection complete indication signal from the reference clock control logic 410 indicating a completion of the Fault Injection Operating Mode.

Once the fault injection complete indication signal is received by the FSM 406, the FSM 406 will read the status registers 407 to determine in the process block 524 whether FHH and/or FLL events were generated. If both FHH and FLL events were generated, then in the process block 525 the FSM 406 will output a signal that there was no fault detected (i.e., the CMU 101 is functioning in accordance with specified operating parameters). Such a signaling may be transmitted from the output logic 408 via the fault injection pass indicators 452 signaling paths as an assertion (or de-assertion as the case may be) of the synchronously and/or asynchronously generated pass/fail signals. If, however, either an FHH or FLL event was not generated, then the FSM 406 will determine in the process block 526 that a fault was detected (i.e., the CMU 101 is not functioning in accordance with specified operating parameters) and output corresponding signals via the fault injection pass indicators 452 signaling paths as a de-assertion (or assertion as the case may be) of the synchronously and/or asynchronously generated pass/fail signals. In accordance with embodiments of the present disclosure, the asynchronously generated pass/fail signal (e.g., whether asserted or de-asserted) may be performed by combinatorial logic circuits within the output logic 408 as a function of the assertion/de-assertion of the FHH and FLL event signals. Such synchronously and/or asynchronously generated pass/fail signals may be communicated to the software program operating in a processor 106 via the access bus 109.

Figure 6:
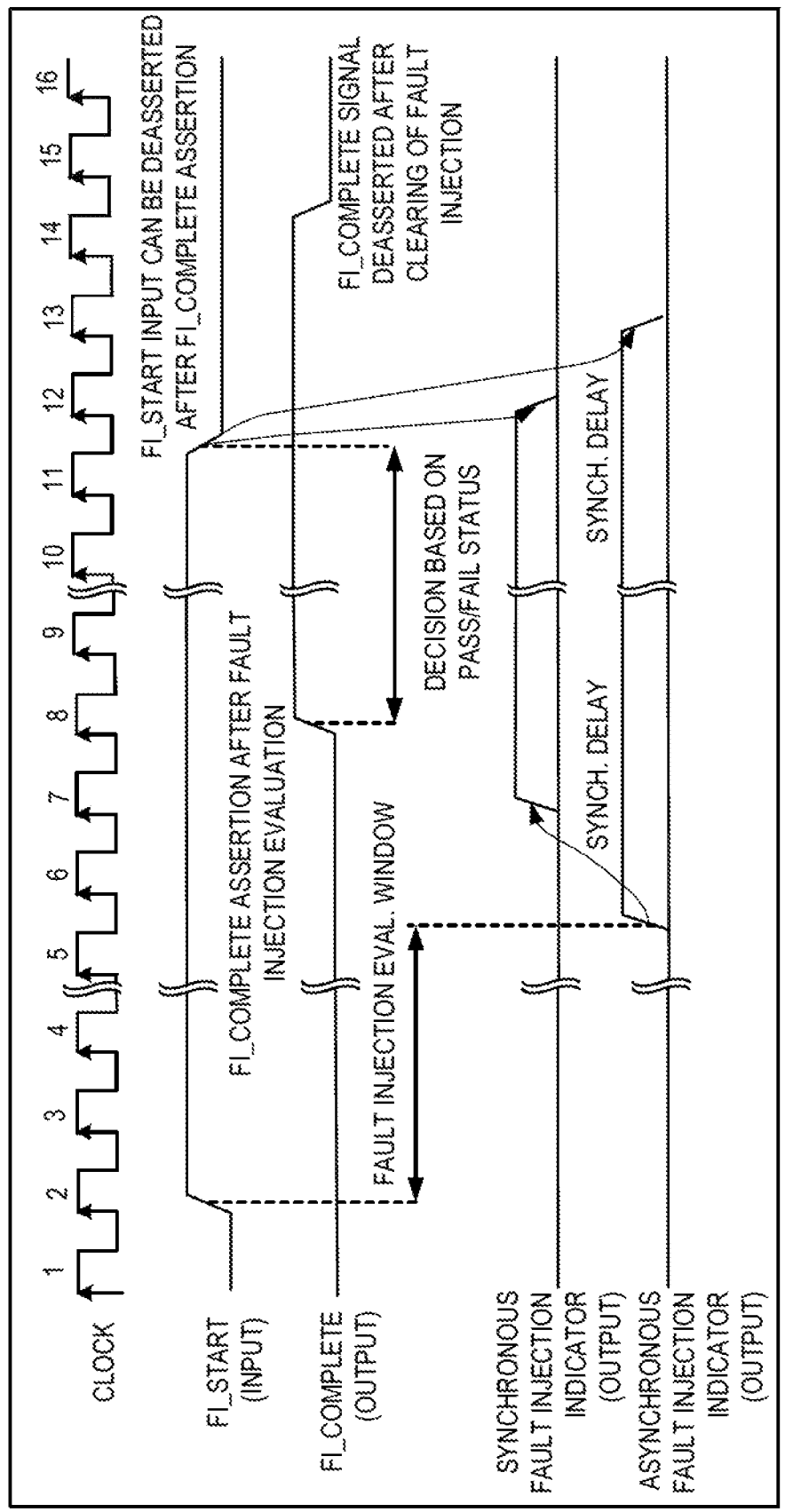
FIG. 6 illustrates a timing diagram of an exemplary operation of a clock monitor unit in accordance with embodiments of the present disclosure.

FIG. 6 illustrates a timing diagram of an exemplary operation of the Fault Injection Operating Mode. Though the timing diagram illustrates a Clock signal representing the clock source 104, the timing of the various signals illustrated in FIG. 6 are merely exemplary and nonlimiting on embodiments of the present disclosure, but are representative of the relative timings of the illustrated signals. As shown, the FSM 406 will commence the Fault Injection Operating Mode, as described herein with respect to FIGS. 5A-5B when it senses assertion (or de-assertion as the case may be) of the FI_Start signal (e.g., see the process blocks 511, 521). The Fault Injection Evaluation Window represents the clock monitoring control logic 460 evaluating the monitored clock 103 (e.g., see the process blocks 512, 522).

At the end of the fault injection evaluation window, in which the reference clock control logic 410 has delivered results (i.e., the FHH/FLL events) of the evaluation to the register interface clock domain module 401, and stored the results in the status registers 407, the FSM 406 will output the fault injection pass indicators 452, which may include a synchronously generated pass/fail signal and an asynchronous pass/fail signal. In accordance with certain embodiments of the present disclosure, the asynchronous pass/fail signal may be automatically output from the CMU 101 in direct response to a generation of the FHH/FLL events (e.g., via combinatorial logic with the output logic 408). The output level (e.g., logic high or low) of each of the signals will indicate whether the operation of the Fault Injection Operating Mode produced a pass or fail result (i.e., the CMU 101 is or is not functioning in accordance with specified operating parameters). Since the synchronous pass/fail signal has to travel through the synchronizers 409, it may be delayed in its output from the CMU 101 relative to the output of the asynchronous pass/fail signal.

The FSM 406 will then store the fault injection complete indication signal in the configuration registers 405, which may be accessed by the software program running in a processor 106 via the fault injection interface 420. The software program that is running in one of the processor(s) 106 that is monitoring the CMU 101 and/or taking corrective action based on the Fault Injection Operating Mode pass/fail results will then be made aware of the completion of the Fault Injection Operating Mode when it receives the fault injection complete indication signal from the CMU 101, and it can then make decisions based on the output synchronously and/or asynchronously generated pass/fail signals.

Thereafter, the software program may de-assert the FI_Start signal after it receives the fault injection complete indication signal. The FSM 406 may then be configured to de-assert the fault injection complete indication signal after it senses the de-assertion of the FI_Start input signal and it has cleared the status registers 407 of the synchronously and/or asynchronously generated pass/fail signals.

Possible corrective action(s) taken by the software program can vary depending on the implementation. For example, the software program may trigger an alarm output from the integrated circuit 100 to notify other logic circuitry or appropriate personnel or a user of a fault of the application being implemented by the integrated circuit 100, disable the processing circuitry 102 from further processing or operation, such as by generating an interrupt for the processing circuitry 102, or cause a clock signal from a secondary clock source (e.g., a clock source 104) to be provided to the processing circuitry 102 (via a clock selector (not shown)).

Referring to FIG. 5A, the CMU 101 may be configured to operate in accordance with the Automatic Fault Injection Operating Mode. As previously noted, the Automatic Fault Injection Operating Mode includes features of both the Functional Operating Mode and the Fault Injection Operating Mode. Therefore, in the process block 503, the parameters previously described for performing operation of the CMU 101 in accordance with these two modes (i.e., REFCOUNT, HFREF, LFREF, FI_REFCOUNT, FI_HFREF, and FI_LFREF) may be delivered to the CMU 101 for storage within the configure registers 405 along with an enable signal indicating that the CMU 101 is to be operated in accordance with the Automatic Fault Injection Operating Mode, and an automatic fault injection repeat count value (labeled as "N" in the process block 557), which is further described herein.

In the process block 553, the FSM 406 will sense that the enable signal indicating operation in accordance with the Automatic Fault Injection Operating Mode has been set within the configuration registers 405. As a result, the FSM 406 will proceed to the process block 554 to configure the CMU 101 for the Automatic Fault Injection Operating Mode, which will include loading the foregoing parameters into the reference clock control logic 410. The FSM 406 will then initiate commencement of the Automatic Fault Injection Operating Mode by sending a Start signal to the reference clock control logic 410.

In the process block 555, the clock monitoring control logic 460 will perform an evaluation of the monitored clock 103 in a manner as similarly described with respect to the process block 505, and correspondingly generate the results of such an evaluation at the end of the measurement window (i.e., the FHH/FLL event signals). In the process block 556, the FSM 406 will sense the values of the generated FHH/FLL event signals.

If it is determined in the process block 556 that no FHH/FLL event has been generated, then in the process block 570, the FSM 406 may output via the functional status indicators 451 that the monitored clock 103 is operating within its predetermined acceptable frequency range. In the process block 557, the automatic fault injection repeat counter 414 will increment (e.g., the automatic fault injection repeat counter 414 increments with passage of each measurement window as a function of the REFCOUNT parameter and the frequency of the reference clock 105) and the reference clock control logic 410 will determine whether the new count value is equal to the predetermined automatic fault injection repeat count value (labeled as "N" in the process block 557). If not, the clock monitoring control logic 460 will perform another evaluation of the monitored clock 103 for another measurement window in the process block 555. The loop of the process blocks 555-557 will continue until the reference clock control logic 410 determines that the automatic fault injection repeat counter 414 has incremented to a value equal to the automatic fault injection repeat count value, whereby in the process block 557 the reference clock control logic 410 will initiate performance of the fault injection operating mode by swapping the HFREF and LFREF values, such as previously described with respect to the process block 521. In the process block 558, the clock monitoring control logic 460 will operate in accordance with the Fault Injection Operating Mode in a manner as similarly described with respect to the process blocks 512 and 522 to evaluate whether the CMU 101 is functioning in accordance with its specified operating parameters. In the process block 559, the FSM 406 will sense the values of the FHH/FLL event signals to determine whether the CMU 101 is operating in accordance with specified operating parameters. If both FHH/FLL events are generated, then the FSM 406 may output in the process block 572 appropriate signals indicating that the CMU 101 is operating in accordance with specified operating parameters, such as previously described with respect to the process blocks 515, 525. Then, the CMU 101 will return to the process block 555 to operate in accordance with the Functional Operating Mode. If in the process block 559, both of the FHH/FLL events were not generated in response to performance of the Fault Injection Operating Mode (indicating that the CMU 101 is not operating in accordance with specified operating parameters), then in the process block 560, the FSM 406 will output appropriate signals in response thereto via the automatic fault injection fail indicators signal lines 453.

If it is determined in the process block 556 that either of the FHH/FLL events has been generated, then the FSM 406 may output the corresponding results in the process block 571 (such as previously described with respect to the process block 508) indicating that the monitored clock 103 is not operating within the specified frequency range. External hardware logic or a software program that is running in a processor 106 within the integrated circuit 100 may then take appropriate action in response to the indication that the monitored clock 103 is not operating within the specified frequency range. Nevertheless, the CMU 101 continues performing the monitoring of the monitored clock 103 (the process block 555) in the next measurement window. However, because it has been determined that the monitored clock 103 is not operating within the specified frequency range, the process block 555 may deactivate counting within the automatic fault injection repeat counter 414 or ensure that the count value of the automatic fault injection repeat counter 414 is set to be less than N so that the CMU 101 does not enter into the Fault Injection Operating Mode until the monitored clock 103 is repaired in some manner.

Thus, it can be readily appreciated that the Automatic Fault Injection Operating Mode involves performing a predetermined number of evaluations (i.e., the counted measurement windows) of the monitored clock 103 in accordance with the Functional Operating Mode before performing an evaluation of the health of the CMU 101 in accordance with the Fault Injection Operating Mode, wherein the periodic evaluation of the health of the CMU 101 is a function of the predetermined automatic fault injection repeat count value, the value of the REFCOUNT parameter, and the cycle frequency of the reference clock 105.

FIGS. 8A-8E illustrate exemplary timing diagrams representing the various operations of the CMU 101 in accordance with the Functional Operating Mode, the Fault Injection Operating Mode, and the Automatic Fault Injection Operating Mode. In these diagrams, the blocks labeled as "CNFIG" indicate those process blocks within the various modes where the parameters for configuring the modes are provided to the CMU 101 (e.g., stored within the configuration registers 405). The blocks labeled as "Start" indicate initiation of the respective modes (e.g., by the FSM 406). The blocks labeled as "Func" indicate each of the measurement windows during performance of the CMU 101 in accordance with the Functional Operating Mode. The blocks labeled as "Fault Inj" indicate performance of the Fault Injection Operating Mode. The blocks labeled as "Stop" indicate discontinuing of the respective mode, such as instructed by external hardware logic or a software program that is running in a processor 106.

Figure 8A:
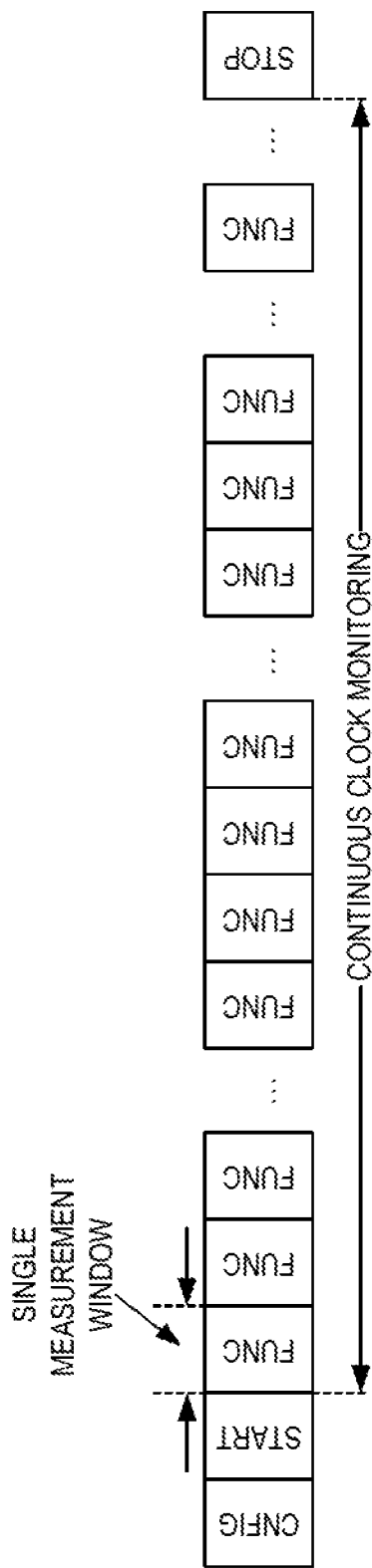
FIG. 8A illustrates an exemplary operation of continuous clock monitoring by a clock monitor unit.

FIG. 8A represents an exemplary performance of the Functional Operating Mode. The "CNFIG" block corresponds to the process block 503, while the "Start" block corresponds to the process block 504. Each of the blocks labeled as "Func" correspond to each of the measurement windows during performance of the Functional Operating Mode (e.g., see the process blocks 505-508). In accordance with certain embodiments of the present disclosure, each of the "Func" blocks may represent a continuous monitoring of the monitored clock 103 (e.g., a continuous performance of the process block 505).

Figure 8B:
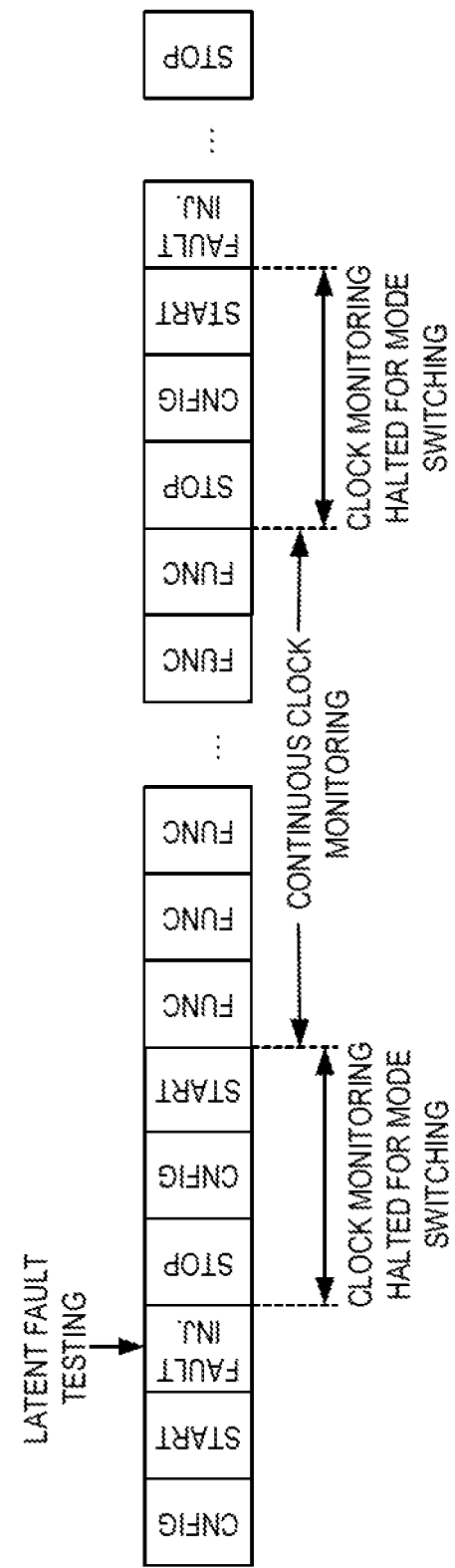
FIG. 8B illustrates an exemplary operation of switching between a Functional Operating Mode and a Fault Injection Operating Mode by a clock monitor unit.

FIG. 8B illustrates a diagram of exemplary operations of the CMU 101 whereby the Functional Operating Mode is interrupted by the Fault Injection Operating Mode as described with respect to FIGS. 5A-5B. As an example, the first "Fault Inj" block could pertain to the process block 502 (and then either the process blocks 510-516 or 520-526) whereby the CMU 101 is configured to operate in accordance with the Fault Injection Operating Mode. As can be seen, the subsequent "Stop" and "CNFIG" blocks indicate that the CMU 101 has then been configured to operate in accordance with the Functional Operating Mode as previously described with respect to the process blocks 503-508. The Functional Operating Mode will be performed on a continuous basis until external hardware logic or a software program that is running in a processor 106 within the integrated circuit 100 instructs the CMU 101 to interrupt the Functional Operating Mode (i.e., the next "Stop" block) and perform the Fault Injection Operating Mode such as described with respect to FIGS. 5A-5B (e.g., see the process blocks 502, 510-516, 520-526).

Figure 8C:
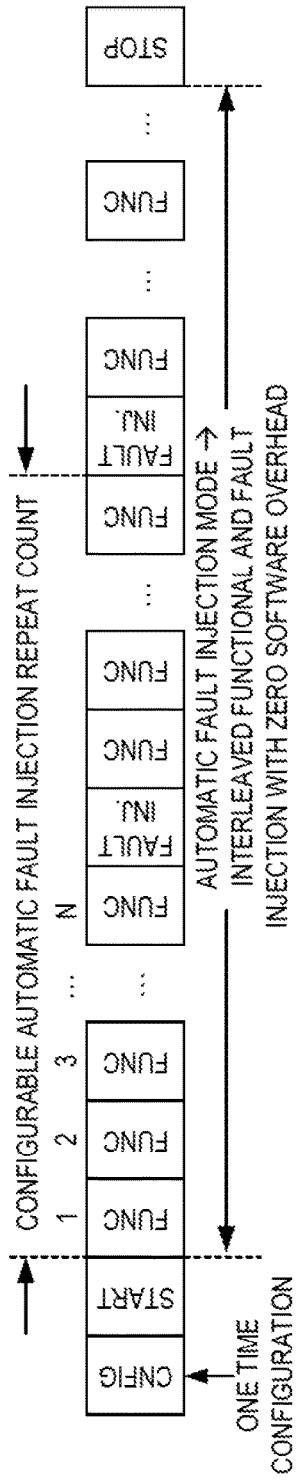
FIGS. 8C-8E illustrate exemplary operations of a clock monitor unit in accordance with embodiments of the present disclosure.
Figure 8D:
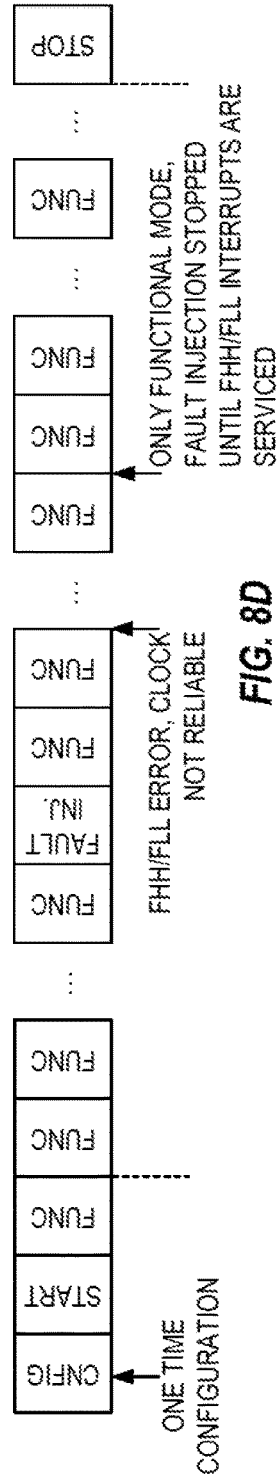
Figure 8E:
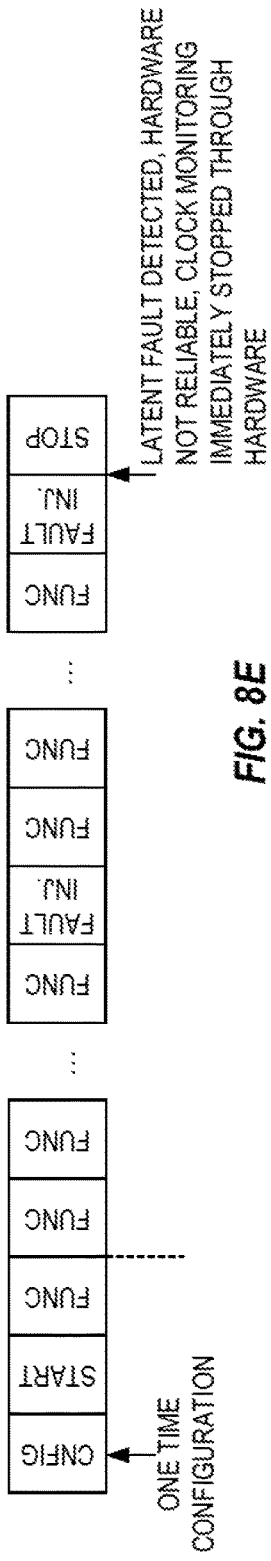

FIGS. 8C-8E illustrate diagrams of exemplary operations of the Automatic Fault Injection Operating Mode. As indicated within each of these diagrams, the "CNFIG" block represents configuration of the CMU 101 to operate in accordance with the Automatic Fault Injection Operating Mode as described herein. The "CNFIG" blocks represent how the CMU 101 may be configured to operate in accordance with the Automatic Fault Injection Operating Mode (e.g., at startup of the integrated circuit 100), and thus there is not a requirement for external hardware logic or a software program that is running in a processor 106 to interrupt the Functional Operating Mode in order to perform the Fault Injection Operating Mode (as described with respect to FIG. 8B), which would include configuring the CMU 101 each time there is a switching between these modes. For example, the "CNFIG" blocks could represent the functions performed in the process blocks 503 and/or 554.

FIG. 8C illustrates operation of the Automatic Fault Injection Operating Mode in accordance with the previously described process blocks 555-559 when no FHH/FLL events are generated during N measurement windows of the Functional Operating Mode indicating that the monitored clock 103 is healthy, and both FHH/FLL events are generated during a measurement window of the Fault Injection Operating Mode indicating that the CMU 101 is healthy.

FIG. 8D illustrates a diagram of an exemplary operation of the Automatic Fault Injection Operating Mode when the process block 556 indicates that an FHH/FLL event has been generated indicating that the monitored clock 103 is not functioning within its specified frequency range, and the Automatic Fault Injection Operating Mode returns to the process block 555 to continue monitoring of the monitored clock 103 in accordance with the Functional Operating Mode. For example, in such an exemplary process, the Fault Injection Operating Mode may be discontinued until the integrated circuit 100 services the faulty monitored clock 103 or takes some other action with respect to the situation where the monitor clock 103 is not operating within its specified frequency range.

FIG. 8E illustrates a diagram of an exemplary operation of the Automatic Fault Injection Operating Mode when the process block 559 indicates that the CMU 101 is not operating in accordance with its specified operating parameters, i.e., the process block 560. In such an instance, the CMU 101 may be taken out of service or some other appropriate action may be taken by external hardware logic or a software program that is running in a processor 106.

Figure 7:
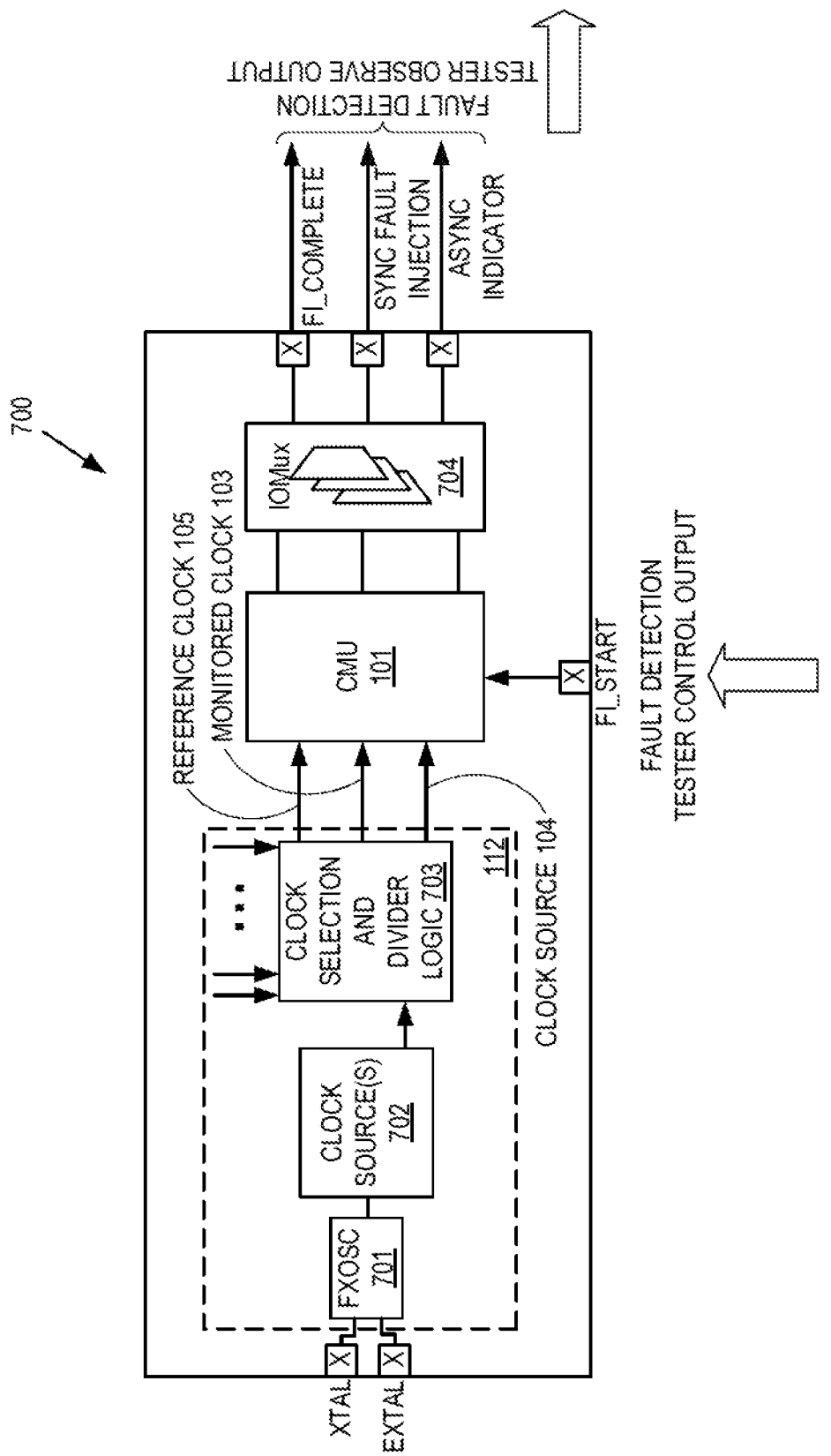
FIG. 7 illustrates a block diagram of utilization of test equipment for testing a clock monitor unit in accordance with embodiments of the present disclosure.

FIG. 7 illustrates an exemplary embodiment in which a CMU 101 (or an integrated circuit 100 in which a CMU 101 is implemented) may be evaluated in accordance with the Fault Injection Operating Mode (e.g., as described with respect to the process blocks 511-516) using an external tester such as an Automatic Test Pattern Generator ("ATPG") 700. The CMU 101 may receive the monitored clock 103, the clock source 104, and the reference clock 105 from clock selection and divider logic 703, which receives one or more of the clock signals from clock source(s) 702. An external crystal oscillator FXOSC 701 may provide a source for the clock signals. The FI_Start signal may be supplied to the CMU 101 through an input from the tester 700. If more than one CMU 101 is being tested, then selection of which outputs from which CMU 101 are to be output from the tester 700 can be performed by an input/output multiplexer 704, which outputs the fault injection complete indication signal and the synchronously and/or asynchronously generated pass/fail signals to the tester 700.

Embodiments of the present disclosure provide a method for operating a clock monitor unit configured to monitor a clock signal, wherein the method includes performing an evaluation whether the clock signal has an operating frequency within a specified frequency range during a first measurement window; and determining whether the clock monitor unit is accurately performing an evaluation whether the clock signal has an operating frequency within the specified frequency range during a second measurement window by (1) determining whether the operating frequency of the clock signal is higher than a first frequency value predetermined to be lower than the operating frequency of the clock signal during the second measurement window and (2) determining whether the operating frequency of the clock signal is lower than a second frequency value predetermined to be higher than the operating frequency of the clock signal during the second measurement window. The evaluation whether the clock signal has an operating frequency within the specified frequency range may include (1) determining whether the operating frequency of the clock signal is lower than the first frequency value predetermined to be higher than the operating frequency of the clock signal during the first measurement window and (2) determining whether the operating frequency of the clock signal is higher than the second frequency value predetermined to be lower than the operating frequency of the clock signal during the first measurement window. The method may further include performing an evaluation whether the clock signal has an operating frequency within the specified frequency range during a third measurement window, wherein the first, second, and third measurement windows are performed in succession. The evaluation whether the clock signal has an operating frequency within the specified frequency range may be performed for a predetermined number of consecutive measurement windows before the second measurement window. The method may further include outputting a signal from the clock monitor unit that the clock monitor unit is not functioning in accordance with specified operating parameters when it is determined that either the operating frequency of the clock signal is not higher than the first frequency value or not lower than the second frequency value. The method may further include performing an evaluation whether the clock signal has an operating frequency within the specified frequency range during a third measurement window when it is determined that the operating frequency of the clock signal is higher than the first frequency value and lower than the second frequency value, wherein the first, second, and third measurement windows are performed in succession.

Embodiments of the present disclosure provide an integrated circuit including logic circuitry suitable for performing a function within the integrated circuit; a clock source suitable for providing a clock signal to the logic circuitry, wherein the clock signal is specified to operate at an operating frequency; and a clock monitor unit suitable for monitoring the clock signal, wherein the clock monitor unit is configured to perform a first comparison of an operating frequency of the clock signal to a first frequency value predetermined to be less than the operating frequency; perform a second comparison of the operating frequency of the clock signal to a second frequency value predetermined to be greater than the operating frequency; repeat the first and second comparisons when (1) the first comparison determines that the operating frequency is greater than or equal to the first frequency value and (2) the second comparison determines that the operating frequency is less than or equal to the second frequency value; and repeat the first and second comparisons when (1) the first comparison determines that the operating frequency is less than the first frequency value and (2) the second comparison determines that the operating frequency is greater than the second frequency value. The clock monitor unit may be configured to repeat the first and second comparisons when either (1) the first comparison determines that the operating frequency is less than the first frequency value or (2) the second comparison determines that the operating frequency is greater than the second frequency value. The clock monitor unit may be configured to output a signal indicating that the clock signal is not operating within a specified frequency range when either (1) the first comparison determines that the operating frequency is less than the first frequency value or (2) the second comparison determines that the operating frequency is greater than the second frequency value. The clock monitor unit may be configured to repeat the first and second comparisons N additional times, where N≥1 when (1) the first comparison determines that the operating frequency is greater than or equal to the first frequency value and (2) the second comparison determines that the operating frequency is less than or equal to the second frequency value. The clock monitor unit may be configured to discontinue performing the first and second comparisons when (1) the first comparison determines that the operating frequency is not less than the first frequency value and/or (2) the second comparison determines that the operating frequency is not greater than the second frequency value. The clock monitor unit may be configured to output a signal indicating that the clock monitor unit is not functioning in accordance with specified operating parameters when (1) the first comparison determines that the operating frequency is not less than the first frequency value and/or (2) the second comparison determines that the operating frequency is not greater than the second frequency value. The clock monitor unit may be configured to discontinue performing the first and second comparisons when (1) the first comparison determines that the operating frequency is not less than the first frequency value and/or (2) the second comparison determines that the operating frequency is not greater than the second frequency value. The clock monitor unit may be configured to output a signal indicating that the clock monitor unit is not functioning in accordance with specified operating parameters when (1) the first comparison determines that the operating frequency is not less than the first frequency value and/or (2) the second comparison determines that the operating frequency is not greater than the second frequency value. The integrated circuit may further include circuitry configured to deactivate the clock monitor unit in response to the signal.

Embodiments of the present disclosure provide a clock monitor unit configured to evaluate whether a frequency of a monitored clock is operating within a specified frequency range by determining whether counted pulses of the monitored clock are less than or equal to a first pulse count value and greater than or equal to a second pulse count value, wherein the clock monitor unit includes logic circuitry configured to perform a first evaluation of the monitored clock utilizing a high frequency threshold count for the first pulse count value and a low frequency threshold count for the second pulse count value, wherein the high frequency threshold count represents a highest acceptable frequency of the specified frequency range, and wherein the low frequency threshold count represents a lowest acceptable frequency of the specified frequency range; and logic circuitry configured to perform a second evaluation of the monitored clock utilizing the high frequency threshold count for the second pulse count value and the low frequency threshold count for the first pulse count value. During the second evaluation, the logic circuitry may be configured to output a signal that the clock monitor unit is functioning in accordance with specified operating parameters when it is determined that the frequency of the monitored clock is both higher than the specified frequency range and lower than the specified frequency range. The clock monitor unit may further include logic circuitry configured to repeat the first evaluation a predetermined number of times when the counted pulses of the monitored clock are less than the high threshold frequency count and greater than the low frequency threshold count before performing the second evaluation. The clock monitor unit may further include logic circuitry configured to repeat the first evaluation a predetermined number of times when it is determined that the frequency of the monitored clock is operating within the specified frequency range. During the second evaluation, the logic circuitry may be configured to output a signal that the clock monitor unit is not functioning in accordance with specified operating parameters when it is determined that the frequency of the monitored clock is lower than the specified frequency range or higher than the specified frequency range.

A number of embodiments of the disclosure have been described. Nevertheless, it will be understood that various modifications may be made without departing from the spirit and scope of the present disclosure. Accordingly, other embodiments are within the scope of the following claims.

The instructions, states, and/or flowchart steps and paths in FIGS. 5A-5C and/or FIG. 6 can be executed in any order, unless a specific order is explicitly stated. Also, those skilled in the art will recognize that while one example set of instructions/states/paths has been discussed, the material in this specification can be combined in a variety of ways to yield other examples as well, and are to be understood within a context provided by this detailed description.

In some example embodiments, the various sets of instructions/states/paths described above may be implemented as functional and software instructions embodied as a set of executable instructions which are effected in a processor (e.g., a processor 106) or in hardware (e.g., the safety logic 107), which is programmed with and controlled by said executable instructions.

In one example, one or more instructions, states, paths, or steps discussed herein are automated. The terms automated or automatically (and like variations thereof) mean controlled operation of an apparatus, system, and/or process using a processor and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

The singular forms "a," "an," and "the" include plural referents unless the context clearly dictates otherwise. As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke a 35 U.S.C. § 112, paragraph six interpretation for that unit/circuit/component.

What is claimed is:

1. A method for operating a clock monitor unit configured to monitor a clock signal, the method comprising:
   performing, by logic circuitry of the clock monitor unit in a functional operating mode, a first comparison of an operating frequency of the clock signal to a specified frequency range during a first measurement window;
   selectively asserting or deasserting, by the logic circuitry in the functional operating mode, one or more event signals based on the first comparison,
   modifying, by the logic circuity in a fault injection operating mode, thresholds that define the specified frequency range to cause a fault during a second measurement window;
   performing, by the logic circuitry in the fault injection operating mode, a second comparison of the operating frequency of the clock signal to the modified thresholds during the second measurement window;
   selectively asserting or deasserting, by the logic circuitry in the fault injection operating mode, the one or more event signals based on the second comparison; and
   generating, by the logic circuitry in the fault injection operating mode, at least one signal indicating successful or failed detection of the fault by the clock monitor unit in the second measurement window based on the one or more event signals.

2. The method as recited in claim 1, further comprising performing, by the logic circuitry in the functional operating mode, a third comparison of the operating frequency to the specified frequency range during a third measurement window, wherein the first, second, and third measurement windows are performed in succession.

3. The method as recited in claim 2, further comprising comparing, by the logic circuitry in the functional operating mode, the operating frequency of the clock signal to the specified frequency range for a predetermined number of consecutive measurement windows before the second measurement window.

4. The method as recited in claim 1, wherein the at least one signal is generated to indicate that the clock monitor unit is not functioning in accordance with specified operating parameters in response to either of a first event signal or a second event signal of the one or more event signals being deasserted in the fault injection operating mode.

5. The method as recited in claim 1, wherein the at least one signal is generated to indicate that the clock monitor unit is functioning in accordance with specified operating parameters in response to both a first event signal or a second event signal of the one or more event signals being asserted in the fault injection operating mode.

6. An integrated circuit comprising:
   logic circuitry configured to perform a function within the integrated circuit;
   a clock source configured to provide a clock signal to the logic circuitry, wherein the clock signal is specified to operate at an operating frequency; and
   a clock monitor unit configured to monitor the clock signal, wherein the clock monitor unit is further configured to:
      perform, in a functional operating mode, a first comparison of an operating frequency of the clock signal to a high frequency threshold value;
      perform, in the functional operating mode, a second comparison of the operating frequency of the clock signal to a low frequency threshold value;
      selectively assert or deassert, in the functional operating mode, a first event signal based on the first comparison;
      selectively assert or deassert, in the functional operating mode, a second event signal based on the second comparison;
      perform, in a fault injection operating mode, a third comparison of the operating frequency of the clock signal to the low frequency threshold value,
      perform, in the fault injection operating mode, a fourth comparison of the operating frequency of the clock signal to the high frequency threshold value;
      selectively assert or deassert, in the fault injection operating mode, the first event signal based on the third comparison;
      selectively assert or deassert, in the fault injection operating mode, a second event signal based on the fourth comparison; and
      generate, in the fault injection operating mode, at least one signal indicating successful or failed detection of a fault based on the first event signal and the second event signal.

7. The integrated circuit as recited in claim 6, wherein the clock monitor unit is configured to output a clock fail signal indicating that the clock signal is not operating within a specified frequency range in response to either (1) the second comparison determining that the operating frequency is less than the low frequency threshold value or (2) the first comparison determining that the operating frequency is greater than the high frequency threshold value.

8. The integrated circuit as recited in claim 6, wherein the clock monitor unit is configured to repeat the first and second comparisons N additional times, where N≥1 in response to (1) the first comparison determining that the operating frequency is greater than or equal to the low frequency threshold value and (2) the second comparison determines that the operating frequency is less than or equal to the high frequency threshold value.

9. The integrated circuit as recited in claim 7, wherein the clock monitor unit is configured to generate the clock fail signal to indicate that the clock monitor unit is not functioning in accordance with specified operating parameters in response to either of the first event signal and the second event signal being asserted in the fault injection operating mode.

10. The integrated circuit as recited in claim 9, further comprising circuitry configured to deactivate the clock monitor unit in response to the clock fail signal indicating that the clock monitor unit is not functioning in accordance with specified operating parameters.

* * * * *